(12) United States Patent
Saitou et al.

(10) Patent No.: US 6,558,983 B2
(45) Date of Patent: May 6, 2003

(54) SEMICONDUCTOR APPARATUS AND METHOD FOR MANUFACTURING THE SAME

(75) Inventors: Masaru Saitou, Nagano (JP); Gen Tada, Nagano (JP); Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/931,604

(22) Filed: Aug. 16, 2001

(65) Prior Publication Data

US 2002/0003288 A1 Jan. 10, 2002

Related U.S. Application Data

(62) Division of application No. 09/223,668, filed on Dec. 30, 1998, now Pat. No. 6,316,794.

(30) Foreign Application Priority Data

Apr. 22, 1998 (JP) .......................... PA10-112299

(51) Int. Cl.[7] .............................................. H01L 21/00
(52) U.S. Cl. ........................................ 438/133; 438/421
(58) Field of Search ................................ 438/354, 355, 438/723, 724, 133, 421; 201/157.41; 257/409, 492

(56) References Cited

U.S. PATENT DOCUMENTS

| | | | |
|---|---|---|---|
| 4,753,716 A | * 6/1988 | Beatty et al. | 201/157.41 |
| 5,107,323 A | 4/1992 | Knolle et al. | 357/54 |
| 5,374,843 A | * 12/1994 | Williams et al. | 257/492 |
| 5,552,625 A | * 9/1996 | Murakami et al. | 257/409 |

FOREIGN PATENT DOCUMENTS

| | | |
|---|---|---|
| EP | 0313249 A1 | 4/1989 |
| JP | 2015630 | 1/1990 |
| JP | 5291241 | 11/1993 |
| JP | 6275852 | 9/1994 |

OTHER PUBLICATIONS

Sorab K. Ghandhi, "VLSI Fabrication Principles, silicon and Gallium Arsenide", 1983, John Wiley&Sons, pp 524.*

"Photoresist Technology for Field"; Semiconductor World 1984, 12, pp. 167–170.

* cited by examiner

*Primary Examiner*—William David Coleman
(74) *Attorney, Agent, or Firm*—Rossi & Associates

(57) ABSTRACT

A semiconductor apparatus is provided which includes a lateral high-voltage semiconductor device which comprises a silicon substrate, a pair of main electrodes formed on the silicon substrate, and a silicon oxide film formed on the silicon substrate, such that at least a part of the silicon oxide film is located between the main electrodes. The semiconductor device further includes a voltage withstanding structure formed on the silicon oxide film, which structure includes a first silicon nitride film having a refractive index of not lower than 2.8, and a second silicon nitride film formed on the first silicon nitride film and having a refractive index of not higher than 2.2.

3 Claims, 5 Drawing Sheets

SEMICONDUCTOR APPARATUS AND METHOD FOR MANUFACTURING THE SAME

This application is a division of application Ser. No. 09/223,668, filed Dec. 30, 1998, now U.S. Pat. No. 6,316,794.

FIELD OF THE INVENTION

The present invention relates in general to a semiconductor apparatus wherein lateral high-voltage devices of 500V or higher-voltage class and an IC for controlling these devices are integrated in the same silicon chip, and in particular to a protective film formed in a voltage withstanding region of the semiconductor apparatus.

BACKGROUND OF THE INVENTION

Power supply switching IC, or the like, is exclusively used for controlling individual high-voltage devices, and such a control IC is generally connected as an external circuit to the high-voltage devices. If this control IC and the high-voltage devices can be integrated in the same silicon chip, the number of components is reduced, and the resulting power supply system may be simplified.

To integrate the high-voltage devices and control IC in the same silicon chip, there is a need to prevent the control IC from operating improperly due to noises occurring upon switching. To this end, the high-voltage devices are configured to provide lateral structures, and all of their electrodes are taken out from one of opposite surfaces of a semiconductor substrate, while the other surface of the substrate is grounded so that the high-voltage devices and control IC integrated in the semiconductor substrate are connected to a common ground. In the lateral structure, however, a high voltage is applied between electrodes formed on the semiconductor substrate, in the lateral direction of the substrate, and therefore an electric field produced by the applied voltage may concentrate at local portions between the electrodes if foreign matters, or the like, are deposited on the surface of the semiconductor substrate. Such concentration of the electric field may cause reduction of the breakdown voltage of the device. Thus, the surface condition of the semiconductor substrate is extremely important in this type of semiconductor apparatus.

Conventionally, a silicon nitride film having a refractive index of 2.8 or higher, which serves as a conductive protective films is used in order to protect the surface of the semiconductor apparatus against contamination, electrically stabilize the apparatus, and thereby prevent concentration of the electric field.

In a conventional process, however, a thin silicon oxide film 11 is undesirably formed on the surface of the silicon nitride film 12, as shown in FIG. 6, and charges are accumulated at the interface between this unnecessary thin silicon oxide film 11 and the silicon nitride film 12. As a result, the silicon nitride film 12 has nonuniform or varying resistance over its area, and the electric field concentrates at local areas of this film, resulting in reduced breakdown voltage of the semiconductor apparatus.

If the semiconductor apparatus is operated in a high-temperature, high-humidity atmosphere after the silicon chip is packaged in a mold resin, oxide films 13 are formed in local portions of the surface of the silicon nitride film 12, as shown in FIG. 7, and cause reduction of the breakdown voltage. Such oxide films 13 are formed because the silicon nitride film 12, which is a conductive protective film, is more hydrophilic and more likely to beoxidized than a conventional insulating protective film. (FIG. 8 shows the chemical reaction that occurs in this silicon nitride film 12 (refer to semiconductor world 1984, 12 p 168).

SUMMARY OF THE INVENTION

The present invention has been developed so as to solve the above problems. It is therefore an object of the present invention to provide a semiconductor apparatus that does not suffer from reduction of its breakdown voltage, and a method for manufacturing such a semiconductor apparatus.

The object may be accomplished according to the first aspect of the present invention, which provides an apparatus comprising a lateral high-voltage semiconductor device which comprises: a silicon substrate; a pair of main electrodes formed on the silicon substrate; a silicon oxide film formed on the silicon substrate, such that at least a part of the silicon oxide film is located between the pair of main electrodes; and a voltage withstanding structure formed on the silicon oxide film to cover the above-indicated at least a part of the silicon oxide film between the main electrodes, the voltage withstanding structure comprising a first silicon nitride film having a refractive index of not lower than 2.8, and a second silicon nitride film formed on the first silicon nitride film and having a refractive index of not higher than 2.2.

In the semiconductor apparatus constructed as described above, the second silicon nitride film is formed as a protective layer for the first silicon nitride film, so as to prevent oxidation of the first silicon nitride film.

The above object may be also accomplished according to the second aspect of the present invention, which provides a method for manufacturing a semiconductor apparatus comprising a lateral high-voltage semiconductor device which comprises a silicon substrate, a pair of electrodes formed on the silicon substrate, and a silicon oxide film formed on the silicon substrate such that at least a part of the silicon oxide film is located between the pair of main electrodes, comprising the steps of: forming a first silicon nitride film having a refractive index of not smaller than 2.8 on the silicon oxide film to cover the above-indicated at least a part of the silicon oxide film between the main electrodes; and removing an unnecessary silicon oxide film formed on the first silicon nitride film.

In the method as described above, the unnecessary, thin oxide film formed on the surface of the first silicon nitride film is removed, thereby to prevent charges from being generated on the first silicon nitride film.

After the above-described step of removing the unnecessary silicon oxide film, a surface of the first silicon nitride film may be treated with hexamethyldisilazane.

In this manner, moisture or water molecules are surely prevented from being deposited on the surface of the first silicon nitride film.

BRIEF DESCRIPTION OF THE DRAWINGS

The invention will be described in greater detail with reference to preferred embodiments thereof and the accompanying drawings, wherein.

DESCRIPTION OF THE PREFERRED EMBODIMENTS

Figure 1:
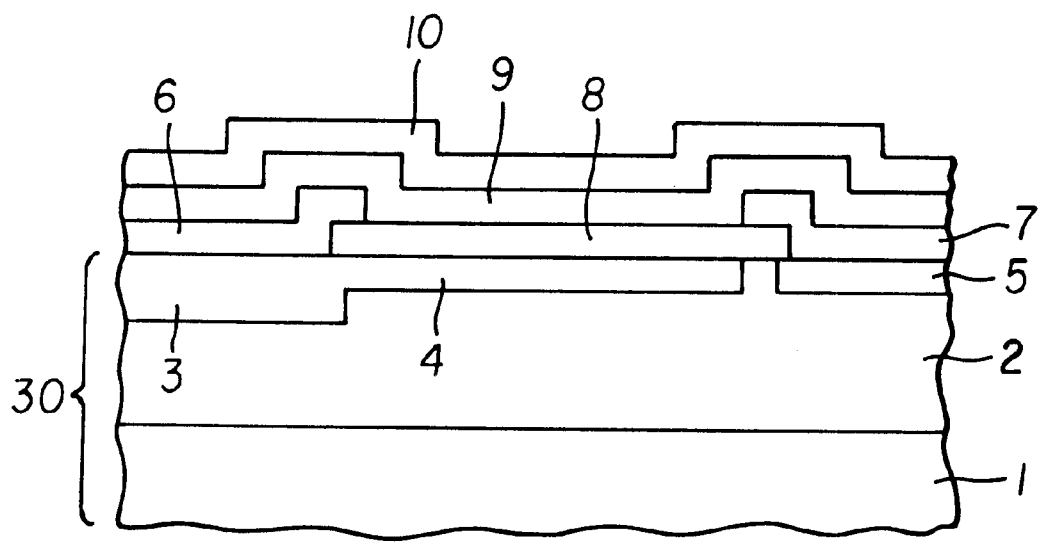
FIG. 1 is a cross-sectional view of a principal part of the first embodiment of the present invention.

FIG. 1 is a cross-sectional view of a principal part of the first embodiment of the present invention. The cross-sectional view of FIG. 1 shows a lateral high-voltage device portion included in a semiconductor apparatus in which lateral high-voltage devices of 500V or higher-voltage class and a control IC are integrated in a silicon chip. To produce this high-voltage device portion, an n well region 2 is formed on a p substrate 1, and a p base region 3, p offset region 4, and an n+ region 5 that is spaced from the p offset region 4 are formed in a surface layer of the n well region 2. The p substrate 1 and the n well region 2 with these regions 3–5 provide a silicon substrate 30. Silicon oxide film 8 is formed on a selected area of the silicon substrate 30 which includes the surface of the p of set region 4, and source electrode 6 and drain electrode 7 are formed on the p base region 3 and n⁴ region 5, respectively. First silicon nitride film 9 having a refractive index 2.8 or higher, which serves as a conductive protective film, is formed on at least the silicon oxide film 8, and second silicon nitride film 10 having a refractive index 2.2 or lower, which serves as an insulating protective film, is formed on the first silicon nitride film 9. The first and second silicon nitride films 9, 10 having different refractive indices may be obtained by changing the ratio of the flow rates of silane ($SiH_4$) and ammonia ($NH_3$) gases. Both of these films 9, 10 have a thickness of 1 μm. In FIG. 1, these silicon nitride films 9, 10 cover the source electrode 8 and drain electrode 7, as well as the silicon oxide film 8. The source electrode 6 and drain electrode 7 are connected to bonding pads at locations not illustrated in FIG. 1. Also, a gate structure of the semiconductor device and the above-indicated control IC to be integrated in the silicon chip are not illustrated in FIG. 1.

The second silicon nitride film 10 that provides an insulating protective film has a lower refractive index than the first silicon nitride film 9 that provides a conductive protective film, and thus functions as a protective film for preventing oxidation of the first silicon nitride film 9 due to moisture, or the like. As the refractive index of a silicon nitride film gets higher, the content of silicon in the film is increased, with a result of an increase in the conductivity. Thus, the refractive index of the first silicon nitride film 9 is preferably not lower than 2.8 and not higher than 3.5. The refractive index of the second silicon nitride film 10 is preferably not higher than 2.2 and not lower than 1.8.

Figure 2A:
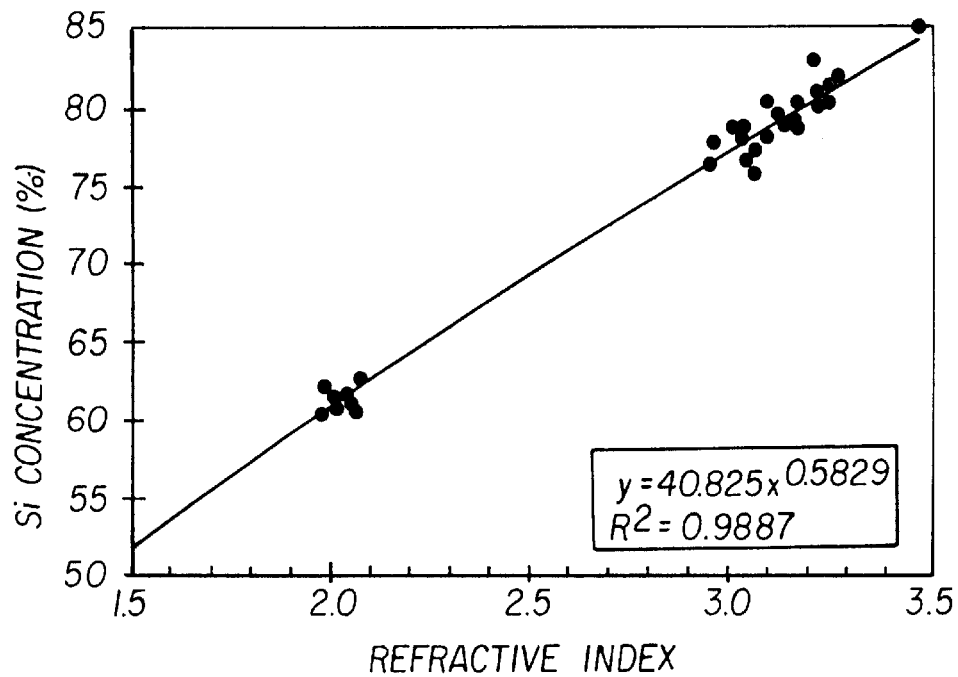
FIG. 2(*a*) is a graph showing the relationship between the silicon concentration in a silicon nitride film, and the refractive index of the film, and FIG. 2(*b*) is a graph showing the relationship between the resistivity and the refractive index.
Figure 2B:
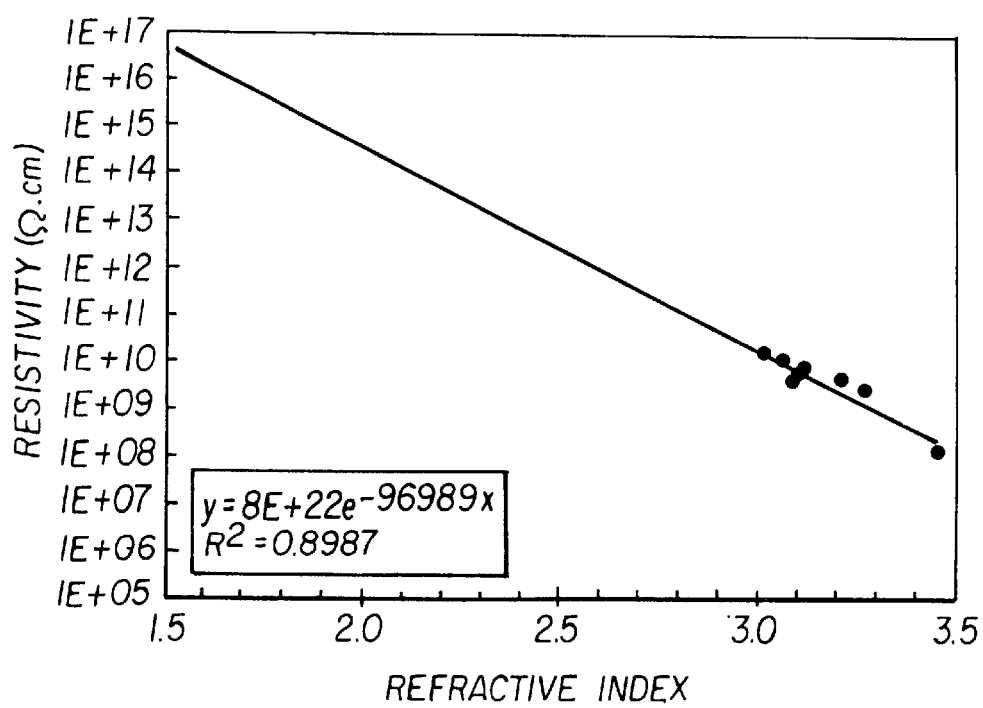
Figure 3A:
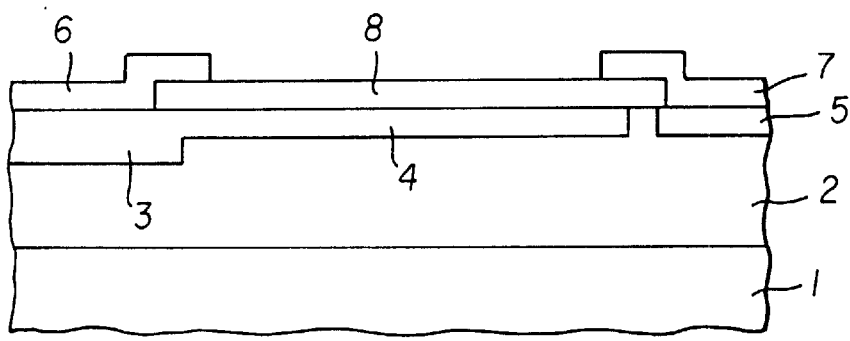
FIG. 3 is a view showing a manufacturing process according to the second embodiment of the present invention, which includes a step of removing an unnecessary silicon oxide film on a first silicon nitride film.
Figure 3B:
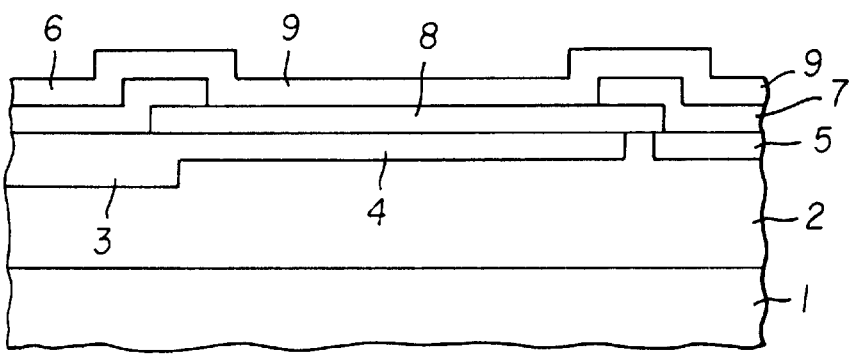
Figure 3C:
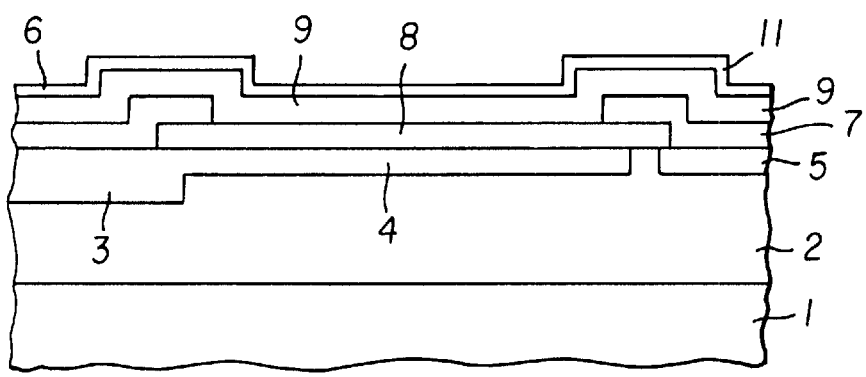
Figure 3D:
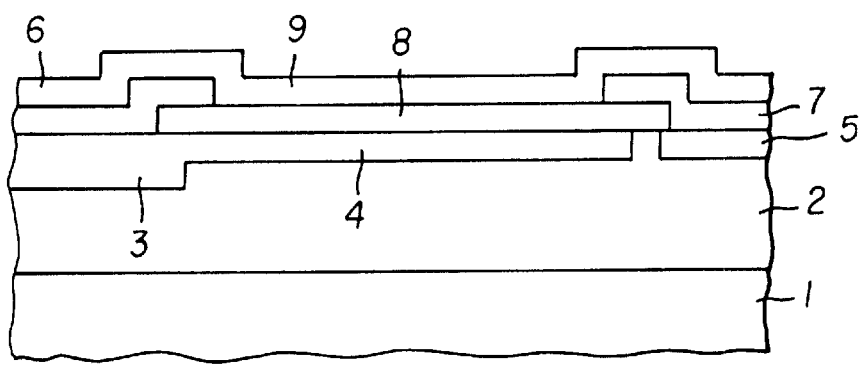

FIG. 2(a) shows the relationship between the silicon concentration in silicon nitride film and the refractive index of the film, and FIG. 2(b) the relationship between the resistivity and the refractive index.

It will be understood from FIG. 2(a) and FIG. 2(b) that the refractive index increases with an increase in the silicon concentration, and the resistivity decreases with an increase in the refractive index. When the silicon concentration is controlled to about 61 at %, the refractive index becomes substantially equal to 2, as shown in FIG. 2(a), and when the refractive index is about 2, the resistivity is on the order of $10^{14} \Omega \cdot cm$, as shown in FIG. 2(b). In this case, the silicon nitride film functions as an insulating film. When the silicon concentration is controlled to about 77 at %, the refractive index becomes substantially equal to about 3, and when the refractive index is about 3, the resistivity is on the order of $10^{10} \Omega \cdot cm$. In this case, the silicon nitride film functions an electrically conductive film. It follows that the refractive index of the first silicon nitride film 9 serving as a conductive protective film is controlled to be not lower than 2.8, and the refractive index of the second silicon nitride film 10 serving as an insulating protective film is controlled to be not higher than 2.2.

FIG. 3 shows a manufacturing process in which an unnecessary silicon oxide film is removed from the first silicon nitride film according to the second embodiment of the present invention. Initially, respective regions are formed in the semiconductor substrate, as shown in FIG. 1, and silicon oxide film 8, source electrode 6 and drain electrode 7 are then formed on the substrate, as shown in FIG. 3(a). Subsequently, the structure thus obtained is subjected to flow of silane ($SiH_4$) and ammonia ($NH_3$) gases so that the first silicon nitride film 9 having a refractive index of 2.8 and a thickness of 1 μm is formed on the silicon oxide film 8 and source and drain electrodes 6, 7, as shown in FIG. 3(b). After a photoresist is applied by coating to the first silicon nitride film 9, this photoresist is subjected to ashing with an oxygen plasma atmosphere, so as to form openings for bonding pad portions. In this ashing process, an unnecessary, thin silicon oxide film 11 is formed on the first silicon nitride film 9, as shown in FIG. 3(c). Then, the unnecessary silicon oxide film 11 is removed by immersing it in a diluted liquid in which the ratio of hydrofluoric acid (HF) and water ($H_2O$) is 1:20, as shown in FIG. 3(d). In this manner, the unnecessary, thin silicon oxide film 11 is prevented from being deposited on the first silicon nitride film 9, and reduction of the breakdown voltage can be avoided. Needless to say, when an unnecessary, thin silicon oxide film 11 is formed on the second silicon nitride film 10 in the embodiment of FIG. 1, this silicon oxide film 11 may be removed in the same process as that of the second embodiment.

Figure 4:
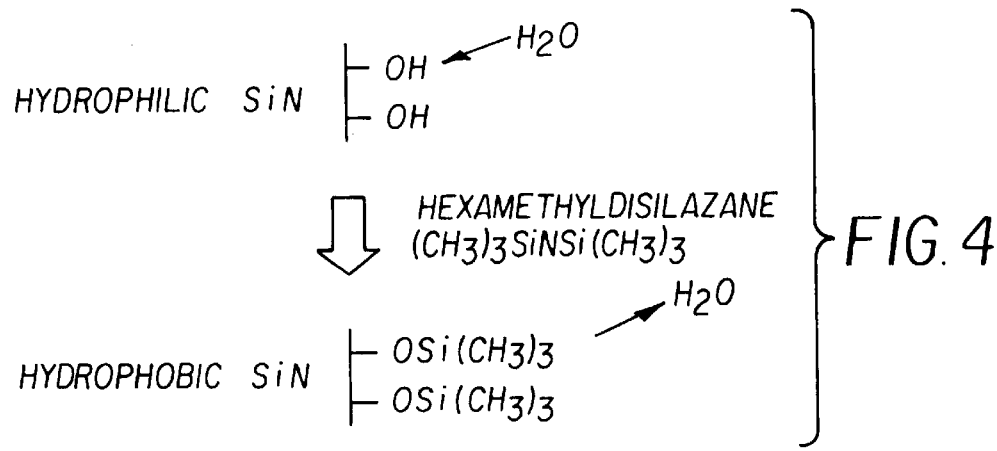
FIG. 4 is a view showing a chemical reaction which occurs when the surface of the first silicon nitride film is treated with hexamethyidisilazane after the process of FIG. 2, according to the third embodiment of the present invention.

FIG. 4 shows a chemical reaction that occurs when the. first silicon nitride film is treated with hexamethyldisilazane after the process of FIG. 3, according to the third embodiment of the present invention. The process of this embodiment will be explained in more detail. After the process of FIG. 3, the first silicon nitride film is baked at 150° C. for 20 minutes so that moisture attached to the surface of the film is evaporated, and then exposed for 15 min. to a gaseous phase (atmosphere) of hexamethyldisilazane (($CH_3)_3$ SiNHSi ($CH_3)_3$) that was bubbled, and replaced with nitrogen for one minute.

In the chemical reaction in the above treatment with hexamethyldisilazane, OH groups on the surface of the first silicon nitride film are converted into OSi ($CH_3)_3$ groups. Due to the effect of the treatment with hexamethyldisilazane, the surface of the first silicon nitride film is changed from a hydrophilic film having OH groups to a hydrophobic film having OSi ($CH_3)_3$ groups, and the moisture or water is prevented from being deposited on the surface of this film.

Figure 5:
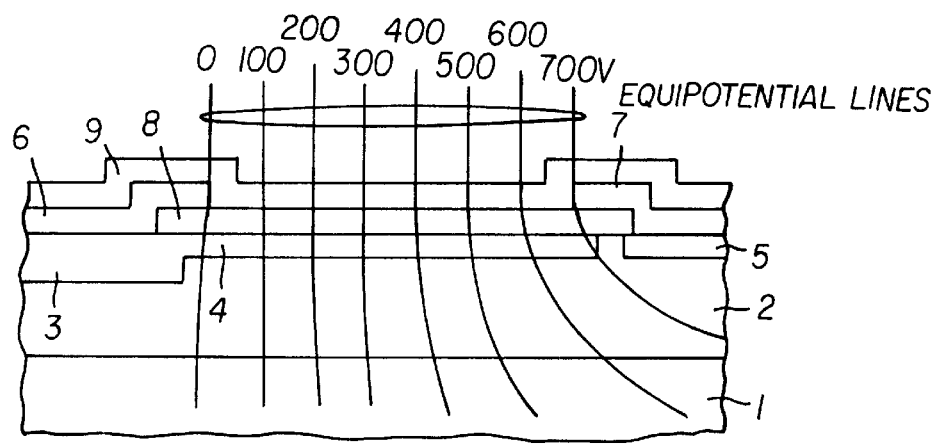
FIG. 5 is a view showing the potential distribution when 700V is applied between source electrode and drain electrode.
Figure 6:
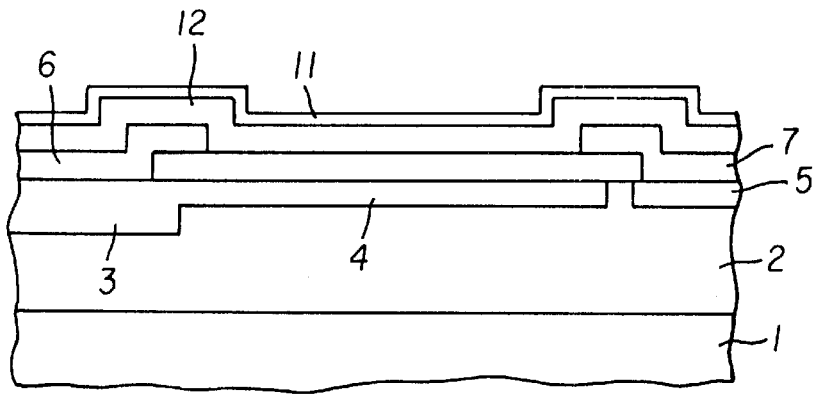
FIG. 6 is a view showing an unnecessary, thin silicon oxide film formed on a surface of a silicon nitride film.
Figure 7:
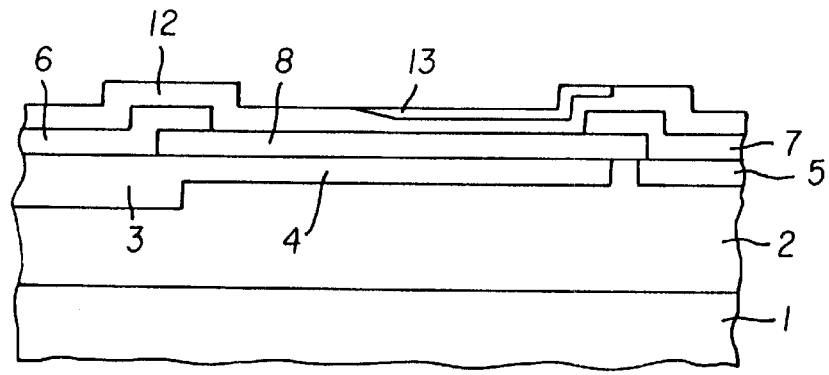
FIG. 7 is a view showing an oxide film formed in a local area of a surface of a silicon nitride film.
Figure 8:
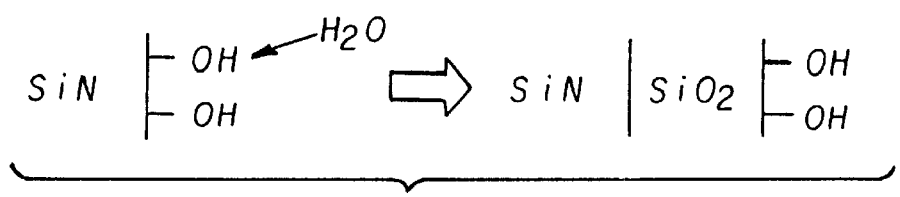
FIG. 8 is a view showing a chemical reaction between a silicon nitride film and water.

FIG. 5 is a view showing the potential distribution between the source electrode 6 and the drain electrode 7 when a voltage of 700V is applied to these electrodes. In the lateral high-voltage device shown in FIG. 5, the surfaces of the source and drain electrodes 6, 7 and the silicon oxide film 8 between the electrodes are covered with the first silicon nitride film 9 having a refractive index of 2.8, which is a conductive protective film that is not oxidized, and no unnecessary thin silicon oxide film is formed on this silicon nitride film 9. FIG. 5 shows equipotential lines with respect to this high-voltage device when 700V is applied between the source electrode and the drain electrode. The equipotential lines are equally spaced from each other, which means that no concentration of electric field occurs, with no reduction of the breakdown voltage. Naturally, the same effect can be obtained when the first silicon nitride film is treated with hexamethyldisilazane, or when the second silicon nitride film is formed on the first silicon nitride film.

In the semiconductor apparatus of the present invention, the protective film has a laminated structure consisting of two layers, namely, the first silicon nitride film serving as a conductive protective film and the second silicon nitride film serving as an insulating protective film. In this two-layer structure, the surface of the first silicon nitride film, which is covered with the second silicon nitride as the insulating protective film, is less likely to be oxidized as compared with that of a single-layer conductive protective film consisting solely of the first silicon nitride film, even in an high-temperature, high-humidity atmosphere in which moisture has a great influence on the film. In the presence of the second silicon nitride film, an unnecessary silicon oxide film is not formed in the ashing step as part of the next photolithography process. Even if the first silicon nitride film is not covered with the second silicon nitride film, oxidation of the surface of the first silicon nitride film may be avoided by adding a process step in which the unnecessary silicon oxide film is removed. Further, the surface of the first silicon nitride film may be treated with hexamethyidisilazane, so as to surely prevent this surface from being oxidized due to moisture or water molecules, for example, which would otherwise be deposited on the surface. In these manners, oxidation of the surface of the first silicon nitride film can be avoided, which leads to improved reliability of the semiconductor apparatus in terms of the breakdown voltage.

What is claimed is:

1. A method for manufacturing a semiconductor apparatus comprising a high-voltage semiconductor device which comprises a silicon substrate, a pair of electrodes formed on the silicon substrate, and a silicon oxide film formed on the silicon substrate such that at least a part of the silicon oxide film is located between the pair electrodes, comprising the steps of:

forming a first silicon nitride film having a refractive index of not smaller than 2.8 on the silicon oxide film to cover said at least a part of the silicon oxide film between the main electrodes; and forming a second silicon nitride film on said first silicon nitride layer, wherein the second silicon nitride film as a refractive index of not higher than 2.2 and smaller than that of the first silicon nitride film.

2. A method as claimed in claim 1, further comprising the steps of performing a manufacturing process step that causes an unnecessary silicon oxide film to be formed on the second silicon nitride film; and removing the unnecessary silicon oxide film formed on the first silicon nitride film.

3. A method as claimed in claim 2, wherein the step of removing the unnecessary silicon oxide film comprises immersing the unnecessary silicon oxide film in a diluted mixture of hydrofluoric acid and water.

* * * * *